(12) United States Patent
Cwiklinski

(10) Patent No.: US 12,015,062 B2
(45) Date of Patent: Jun. 18, 2024

(54) INTEGRATED CIRCUIT

(71) Applicant: Fraunhofer-Gesellschaft zur Förderung der angewandten Forschung e.V., Munich (DE)

(72) Inventor: Maciej Cwiklinski, Kufstein (AT)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 849 days.

(21) Appl. No.: 17/077,579

(22) Filed: Oct. 22, 2020

(65) Prior Publication Data

US 2021/0126096 A1    Apr. 29, 2021

(30) Foreign Application Priority Data

Oct. 24, 2019  (DE) ...................... 10 2019 216 400.5
Mar. 3, 2020  (DE) ...................... 10 2020 202 683.1

(51) Int. Cl.
  *H01L 29/41*  (2006.01)
  *H01L 27/07*  (2006.01)
  *H01L 29/417*  (2006.01)

(52) U.S. Cl.
  CPC .... *H01L 29/41775* (2013.01); *H01L 27/0727* (2013.01)

(58) Field of Classification Search
  None
  See application file for complete search history.

(56) References Cited

U.S. PATENT DOCUMENTS

| | | | |
|---|---|---|---|
| 2,663,806 A | 12/1953 | Darlington | |
| 4,236,119 A | 11/1980 | Battjes | |
| 6,271,542 B1* | 8/2001 | Emma | ................. H01L 27/0688 257/67 |
| 2010/0259296 A1 | 10/2010 | Or-Bach | |
| 2015/0155377 A1 | 6/2015 | Kim | |
| 2017/0033211 A1* | 2/2017 | Xue | .................... H01L 27/0641 |
| 2018/0315709 A1* | 11/2018 | Schultz | ............. H01L 29/42392 |

(Continued)

OTHER PUBLICATIONS

Conlon et al., "GaN Wide Band Power Integrated Circuits," 2006 IEEE Compound Semiconductor Integrated Circuit Symposium, San Antonio, TX, 2006, pp. 85-88, doi: 10.1109/CSICS.2006.319885.

(Continued)

*Primary Examiner* — Bilkis Jahan
(74) *Attorney, Agent, or Firm* — Womble Bond Dickinson (US) LLP

(57) ABSTRACT

An integrated circuit is disclosed comprising at least one first field effect transistor, having at least one first source contact and at least one first drain contact and at least one first gate contact, and at least one second field effect transistor, having at least one second source contact and at least one second drain contact and at least one second gate contact, wherein the first drain contact is connected to the second drain contact, and the first source contact is coupled to the second gate contact, wherein the first source contact, the first drain contact, the first gate contact, the second source contact, the second drain contact and the second gate contact are implemented as structured metallization layers on a single substrate, and the first and second drain contacts share at least one single dedicated surface area on said substrate.

20 Claims, 11 Drawing Sheets

(56) References Cited

U.S. PATENT DOCUMENTS

2019/0006352 A1\* 1/2019 Kobayashi .......... H01L 29/0847

OTHER PUBLICATIONS

Jain et al., "Investigation of HBT layout impact of $f_T$ doubler performance for 90nm SiGe HBTs," 2014 IEEE Bipolar/BiCMOS Circuits and Technology Meeting (BCTM), Coronado, CA, 2014, pp. 5-8, doi: 10.1109/BCTM.2014.6981274.
Krishnamurthy et al., "Broadband GaAs MESFET and GaN HEMT Resistive Feedback Power Amplifiers," IEEE J Solid-State Circuits, Sep. 2000, 35(9):1285-1292.
Nikandish et al., "Design and Analysis of Broadband Darlington Amplifiers With Bandwidth Enhancement in GaAs pHEMT Technology," IEEE Transactions on Microwave Theory and Techniques, Aug. 2014, 62(8):1705-1715.
Weng et al., "Gain-Bandwidth Analysis of Broadband Darlington Amplifiers in HBT-HEMT Process," IEEE Transactions on Microwave Theory and Techniques, Nov. 2012, 60(11):3458-3473.
Karmalkar et al., "Chapter 3: GaN-Based Power High Electron Mobility Transistors," World Scientific Publishing Co Pte Ltd, 2003, http://ebookcentral.proquest.com/lib/epo-ebooks/detail.action?docID=1681778.
European Search Report dated Mar. 3, 2021, issued in application No. EP0031442.

\* cited by examiner

INTEGRATED CIRCUIT

CROSS-REFERENCE TO RELATED APPLICATIONS

This application claims priority under 35 USC § 119 to German Patent Application No. 10 2019 216 400.5, filed Oct. 24, 2019, which is hereby incorporated by reference. Furthermore, this application claims priority under 35 USC § 119 to German Patent Application No. 10 2020 202 683.1, filed Mar. 3, 2020, which is hereby incorporated by reference.

FIELD OF THE INVENTION

The invention relates to an integrated circuit comprising at least one first field effect transistor which has at least one first source contact and at least one first drain contact and at least one first gate contact and comprising at least one second field effect transistor which has at least one second source contact and at least one second drain contact and at least one second gate contact, with the first drain contact being connected to the second drain contact and the first source contact being connected to the second gate contact. Circuits of this type are referred to as fT doublers and are mainly used as high-frequency amplifiers.

From K. Krishnamurthy, R. Vetury, S. Keller, U. Mishra, M. J. W. Rodwell, S. I. Long: "Broadband GaAs MESFET and GaN HEMT resistive feedback power amplifiers", IEEE Journal of Solid-State Circuits, vol. 35, no. 9, September 2000, an fT doubler in the form of an integrated circuit is known. This circuit allows for a gain of 11 dB within a bandwidth of 0.2 GHz to 7.5 GHz. However, there is a need for amplifiers having a much higher operating frequency for applications in the field of radar technology or upcoming 6 G data transmission.

SUMMARY OF THE INVENTION

According to one aspect of the invention, the invention relates to an integrated circuit comprising at least one first field effect transistor, having at least one first source contact and at least one first drain contact and at least one first gate contact, and at least one second field effect transistor, having at least one second source contact and at least one second drain contact and at least one second gate contact, wherein the first drain contact is connected to the second drain contact, and the first source contact is coupled to the second gate contact, wherein the first source contact, the first drain contact, the first gate contact, the second source contact, the second drain contact and the second gate contact are implemented as structured metallization layers on a single substrate, and the first and second drain contacts share at least one single dedicated surface area on said substrate.

According to another aspect of the invention, the invention relates to an integrated circuit, comprising at least one first field effect transistor, having at least one first source contact and at least one first drain contact and at least one first gate contact, and at least one second field effect transistor, having at least one second source contact and at least one second drain contact and at least one second gate contact, wherein the first drain contact is connected to the second drain contact, and the first source contact is coupled to the second gate contact, wherein the first source contact, the first drain contact, the first gate contact, the second source contact, the second drain contact and the second gate contact are implemented as structured metallization layers on a single substrate, and wherein the first and second drain contacts share at least one single dedicated surface area on said substrate, and wherein the first and second drain contacts are configured as a signal output and the first gate contact is configured as a signal input.

According to still another aspect of the invention, the invention relates to an electronic device comprising at least one integrated circuit, said integrated circuit comprising at least one first field effect transistor, having at least one first source contact and at least one first drain contact and at least one first gate contact, and at least one second field effect transistor, having at least one second source contact and at least one second drain contact and at least one second gate contact, wherein the first drain contact is connected to the second drain contact, and the first source contact is coupled to the second gate contact, wherein the first source contact, the first drain contact, the first gate contact, the second source contact, the second drain contact and the second gate contact are implemented as structured metallization layers on a single substrate, and wherein the first and second drain contacts share at least one single dedicated surface area on said substrate, and wherein the first and second drain contacts are configured as a signal output and the first gate contact is configured as a signal input.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the devices. Advantages of embodiments of the devices will be apparent from the following detailed description of the exemplary embodiments thereof, which description should be considered in conjunction with the accompanying drawings in which.

DETAILED DESCRIPTION

Figure 1:
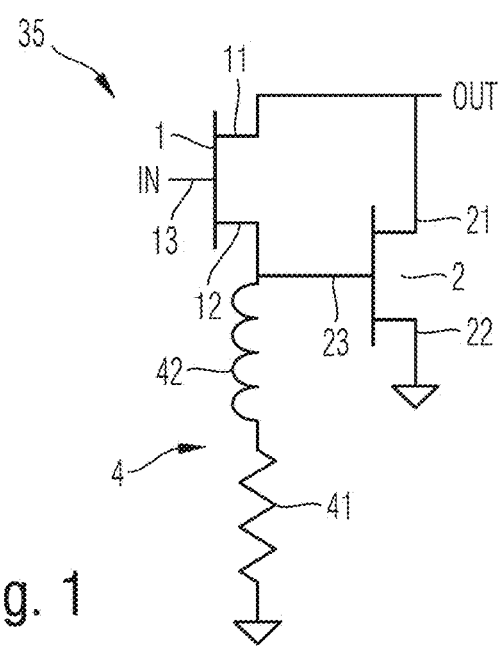
FIG. 1 illustrates a circuit diagram of the integrated circuit according to the first and second embodiments.

As required, detailed embodiments of the devices, products, apparatuses, and methods are disclosed herein; however, it is to be understood that the disclosed embodiments are merely exemplary of the devices, products, apparatuses, and methods which can be embodied in various forms. Therefore, specific structural and functional details disclosed herein are not to be interpreted as limiting, but merely as a basis for the claims and as a representative basis for teaching one skilled in the art to variously employ the devices, products, apparatuses, and methods in virtually any appropriately detailed structure. Further, the terms and phrases used herein are not intended to be limiting; but rather, to provide an understandable description of the devices, products, apparatuses, and methods. While the specification concludes with claims defining the features of the devices, products, apparatuses, and methods that are regarded as novel, it is believed that the devices, products, apparatuses, and methods will be better understood from a consideration of the following description in conjunction with the drawing figures, in which like reference numerals are carried forward.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Alternate embodiments may be devised without departing from the spirit or the scope of the invention. Additionally, well-known elements of exemplary embodiments of the devices, products, apparatuses, and methods will not be described in detail or will be omitted so as not to obscure the relevant details of the systems, apparatuses, and methods.

Before the devices, products, apparatuses, and methods are disclosed and described, it is to be understood that the terminology used herein is for the purpose of describing particular embodiments only and is not intended to be limiting. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element. The terms "including" and/or "having," as used herein, are defined as comprising (i.e., open language). The terms "a" or "an", as used herein, are defined as one or more than one. The term "plurality," as used herein, is defined as two or more than two. The term "another," as used herein, is defined as at least a second or more. The description may use the terms "embodiment" or "embodiments," which may each refer to one or more of the same or different embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "coupled" may mean that two or more elements are in direct physical or electrical contact (e.g., directly coupled). However, "coupled" may also mean that two or more elements are not in direct contact with each other, but yet still cooperate or interact with each other (e.g., indirectly coupled).

For the purposes of the description, a phrase in the form "A/B" or in the form "A and/or B" or in the form "at least one of A and B" means (A), (B), or (A and B), where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables, for example, a phrase in the form "at least one of A, B, and C" means (A), (B), (C), (A and B), (A and C), (B and C), or (A, B and C).

Relational terms such as first and second, top and bottom, and the like may be used solely to distinguish one entity or action from another entity or action without necessarily requiring or implying any actual such relationship or order between such entities or actions. The description may use perspective-based descriptions such as up/down, back/front, top/bottom, and proximal/distal. Such descriptions are merely used to facilitate the discussion and are not intended to restrict the application of disclosed embodiments. Various operations may be described as multiple discrete operations in turn, in a manner that may be helpful in understanding embodiments; however, the order of description should not be construed to imply that these operations are order dependent.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. As used herein, the terms "substantial" and "substantially" means, when comparing various parts to one another, that the parts being compared are equal to or are so close enough in dimension that one skill in the art would consider the same. Substantial and substantially, as used herein, are not limited to a single dimension and specifically include a range of values for those parts being compared. The range of values, both above and below (e.g., "+/−" or greater/lesser or larger/smaller), includes a variance that one skilled in the art would know to be a reasonable tolerance for the parts mentioned.

Herein various embodiments of the systems, apparatuses, and methods are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

According to the invention, an integrated circuit having at least one first field effect transistor and at least one second field effect transistor is disclosed. Each field effect transistor comprises at least one source contact, at least one drain contact and at least one gate contact. The drain and source contacts are arranged adjacent to a channel. The channel is configured to have a variable electrical resistance depending on the gate voltage applied.

According to the invention, the two drain contacts of the first and second field effect transistors are connected to each other. The drain contacts of the first and second field effect transistors represent the output of the amplifier. Furthermore, the source contact of the second field effect transistor is adapted to be connected to a reference potential during operation. In some embodiments of the invention, this reference potential may be a ground potential. The source contact of the first field effect transistor is coupled to the gate contact of the second field effect transistor. The gate contact of the first field effect transistor represents the input of the amplifier. A circuit of this type can be referred to as an fT doubler circuit.

In order to increase the bandwidth or cutoff frequency of the integrated circuit according to the invention beyond the limits of known amplifier circuits, the invention proposes to implement the source, drain and gate contacts of the first and second field effect transistors as at least one structured metallization layer on a substrate. Furthermore, the first and second drain contacts share at least one single dedicated surface area on said substrate. This feature may have the effect that the first and second drain contacts are connected to each other without connecting lines or wires. As a result, parasitic inductances or capacitances may be reduced and the cutoff frequency may be increased. Additionally, the arrangement of the contacts according to the invention reduces the footprint of the integrated circuit on the substrate. This feature may help to reduce the amount of semiconductor material needed so that a larger number of circuits can be manufactured on a given wafer area.

In some embodiments of the invention, the surface area of the metallization used as drain contacts of both field effect transistors has a polygonal shape. In other embodiments of the invention, the surface area of the metallization used as drain contacts of both field effect transistors has a round shape. In some embodiments of the invention, the surface area may be square, in particular rectangular.

In some embodiments of the invention, the metallization layer used for the first and second drain contacts may be designed to form an ohmic contact to the underlying material of the substrate.

In some embodiments of the invention, the integrated circuit may comprise further a direct current path having a first end and a second end, wherein the first end is connected to the second gate contact and the second end is configured to be connected to a reference potential during operation. In some embodiments of the invention, this reference potential may be a ground potential. This direct current path may be adapted to dump the gate charge of the second field effect transistor to the reference potential when the first field effect transistor is blocked, thereby allowing the switching state of both field effect transistors to be in sync, irrespective of the fact that the gate contact is almost currentless.

In some embodiments of the invention, the direct current path comprises any of at least one resistor and/or at least one inductor. In some embodiments, at least one resistor and at least one inductor may be serially connected to one another. This feature may block high-frequency currents from the direct current path so that the gate contact of the second field effect transistor may be charged more quickly, thereby increasing further the cutoff frequency of the integrated circuit.

In some embodiments of the invention, the first and second drain contacts share two dedicated surface areas on said substrate, which are arranged on opposite sides of the surface area of the first source contact. This feature may increase the area of the metallization available for the drain contacts, so that the output current may be increased and/or ohmic losses may be reduced.

In some embodiments of the invention, at least two second source contacts are arranged adjacent to the surface areas of said first and second drain contacts and on the sides of the surface areas of the first and second drain contacts facing away from or being located opposite to the first source contact. Since the integrated circuit has a similar structure as a bipolar Darlington transistor, the second field effect transistor provides a larger part of the output power. By increasing the area of the second source contacts, the output current and thus the output power may be increased. This embodiment has the additional effect that the second source contacts form the outer border of the integrated circuit in at least one direction within the plane defined by the substrate, so that all other elements are arranged within the zone thus defined. Since the second source contacts are configured to be connected to a reference potential, for example a ground potential, they may be used to shield high-frequency interference as well. Finally, the integration of coplanar waveguides on the substrate may be facilitated.

In some embodiments of the invention, the integrated circuit may comprise further at least one capacitor having two connectors being connected to the first source contact and the second gate contact respectively. This allows a bias voltage to be applied to the second gate contact so that the second gate contact is at a different electrical potential than the first source contact.

In some embodiments of the invention, the number and/or area of the surface areas of the second drain contacts and/or the second source contacts may be higher than the number and/or area of the first drain contact and/or of the first source contact. This feature allows the second field effect transistor to contribute a higher percentage of the output power than the first field effect transistor, so that the output power of the integrated circuit may be increased. As the parasitic input capacitances, i.e. the gate-source capacitance of both field effect transistors are connected in series, the smaller capacitance is the dominant one. Therefore, when connecting a smaller first field effect transistor to a larger second field effect transistor, the effective input capacitance of the structure is dominated by the smaller value of the first field effect transistor. Therefore, a relatively large structure with high output power can be driven with a low input capacitance, which may be advantageous for high frequency operation with high bandwidths.

In some embodiments of the invention, the substrate may consist of a semiconductor material. In other embodiments of the invention, the substrate may comprise at least one semiconductor material. In some embodiments, the semiconductor material may be selected from at least one group-III-nitride. Such a group-III-nitride comprises at least one element of the third group of the periodic table and nitrogen.

The group-III-nitride can be selected from a binary, ternary or quaternary compound. For example, the group-III-nitride may be selected from any of GaN, AlN, AlGaN, InGaN, InAlN, InGaN or other compounds not mentioned in detail.

In some embodiments, the semiconductor material may be composed of a plurality of layers of different group-III-nitrides. The plurality of layers may form a semiconductor heterostructure. In some embodiments of the invention, a two-dimensional electron gas may be formed in the semiconductor heterostructure at at least one boundary layer at least during operation of the integrated circuit. As a result, the charge carrier mobility can be increased, so that the cutoff frequency and/or the electrical output power can be increased. Such a plurality of single layers can be deposited on silicon and/or $Al_2O_3$ and/or SiC.

In some embodiments, the semiconductor material may be selected from any of at least one III-V-compound semiconductor or at least one group IV semiconductor or at least one II-VI-compound semiconductor.

In some embodiments of the invention, the substrate may be laterally and/or vertically structured or may have regions comprising any of a different dopant and/or a different dopant concentration.

In some embodiments of the invention, the integrated circuit may have a cutoff frequency of more than 20 GHz. In some embodiments of the invention, the integrated circuit may have a cutoff frequency of more than 40 GHz. In some embodiments of the invention, the integrated circuit may have a cutoff frequency of more than 60 GHz. In some embodiments of the invention, the integrated circuit may have a cutoff frequency of more than 100 GHz. The cutoff frequency is defined as the frequency at which the current gain of the integrated circuit reaches the value unity or 1 when a sine signal is applied to the input and the output is short-circuited.

In some embodiments of the invention, the integrated circuit may have a cutoff frequency which is more than 10% higher than the cutoff frequency of a single field effect transistor in a common source topology, wherein the same manufacturing process is used. In some embodiments of the invention, the integrated circuit may have a cutoff frequency which is more than 20% higher than the cutoff frequency of a single field effect transistor in a common source topology, wherein the same manufacturing process is used. In some embodiments of the invention, the integrated circuit may have a cutoff frequency which is more than 30% higher than the cutoff frequency of a single field effect transistor in a common source topology, wherein the same manufacturing process is used.

In some embodiments of the invention, the integrated circuit may comprise further components in addition to the at least one first field effect transistor and at least one second field effect transistor forming a fT doubler topology. For example, further field effect transistors or amplifier stages may be added (fT tripler). In other embodiments, a common gate (CG) FET may be added. A configuration of this type may be referred to as a cascode. The cascode may improve input-output isolation, as there is no direct coupling from the output to the input. This eliminates or reduces the Miller effect and thus may contribute to a higher bandwidth.

In further embodiments of the invention, the first gate contact of the first field effect transistor may be connected to the output of a common drain (CD) field effect transistor. Finally, the basic circuit disclosed may be implemented several times, wherein the individual fT doubler circuits can be connected in series and/or in parallel.

The integrated circuit according to the invention may be used in electronic devices, for example in an amplifier, a measurement device, a receiver, a transmitter or a similar device. Such an electronic device can be used in mobile radio, in radar technology, in communications technology or similar applications.

Described now are exemplary embodiments. Referring now to the figures of the drawings in detail and first, particularly to FIG. 1.

FIG. 1 illustrates a wiring diagram of the integrated circuit according to the first and second embodiments of the invention detailed below. The circuit comprises at least one first field effect transistor 1 and at least one second field effect transistor 2. The first field effect transistor 1 has a first drain contact 11 and a first source contact 12. Source and drain contacts 11 and 12 limit a channel the conductivity of which is controllable by means of a gate voltage applied to the first gate contact 13 while the circuit is operated.

The second field effect transistor 2 has a second drain contact 21 and a second source contact 22. Furthermore, the second field effect transistor 2 has a second gate contact 23. Source and drain contacts 21 and 22 limit a channel the conductivity of which is controllable by means of a gate voltage applied to the second gate contact 23 while the circuit is operated.

The second source contact 22 is coupled to a reference potential, for example an earth potential or a ground potential, when the circuit is in use. The second gate contact 23 is coupled to the first source contact 12. The first gate contact 13 is configured as an input of the amplifier circuit 35. The two drain contacts 11 and 21 are configured as an output of the amplifier circuit. When an input voltage is applied to the first gate contact 13, the channel between the first source contact 12 and the first drain contact 11 becomes conductive, so that a gate voltage is applied to the second gate contact 23. This gate voltage causes the channel between the second source contact 22 and the second drain contact 21 to become conductive as well.

When switching the gate voltage below the switching threshold at the first gate contact 13, the channel between the first source contact 12 and the first drain contact 11 becomes highly resistive. Since the second gate contact 23 is substantially currentless, the charge collected at the second gate contact 23 is dissipated by means of the direct current path 4. The decreasing gate voltage at the second gate 23 causes the channel between the second source contact 22 and the second drain contact 21 to become highly resistive as well. In order to avoid a high-frequency useful signal being short-circuited to ground potential via the direct current path 4, the direct current path 4 may comprise at least one resistor 41 and/or at least one inductor 42.

The basic circuit shown in FIG. 1 is referred to in the present description as a fT doubler circuit. In some embodiments of the invention, the basic circuit disclosed may be implemented several times on a single substrate, wherein the individual fT doubler circuits can be connected in series and/or in parallel to one another. In other embodiments, at least one fT doubler circuit can be connected to further circuitry, for example Darlington transistors and/or at least one field effect transistor in common source and/or common drain and/or common gate topology.

Figure 2:
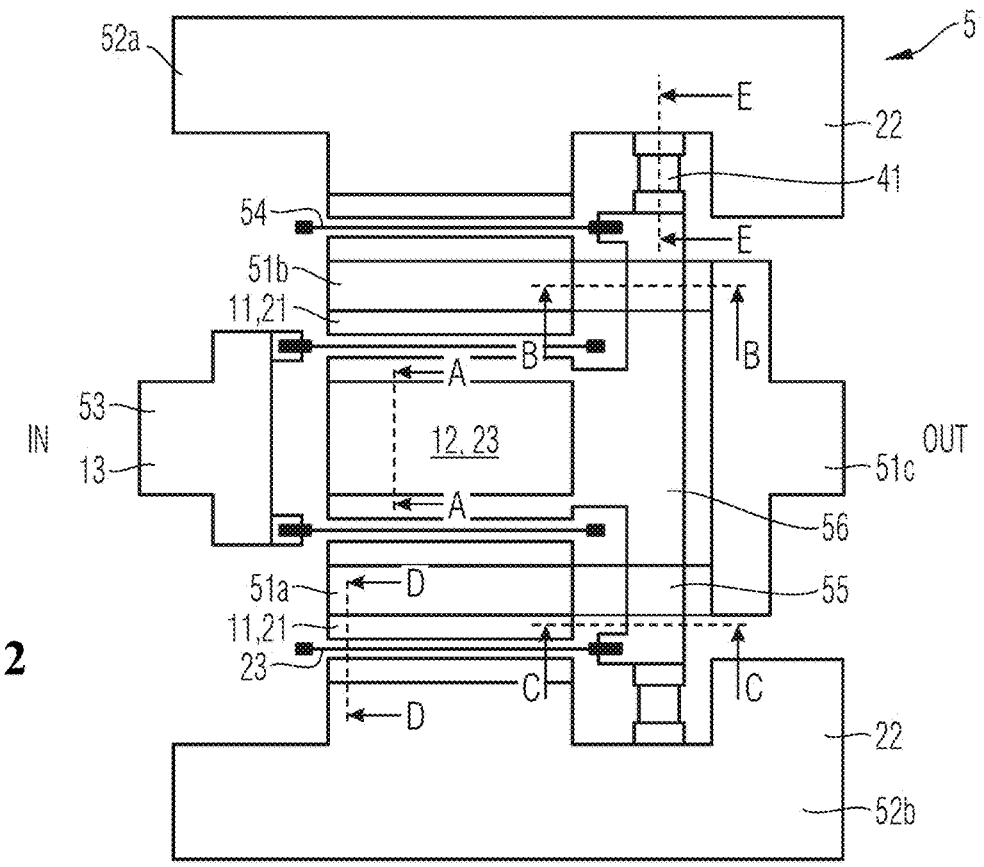
FIG. 2 illustrates a top view of an integrated circuit according to a first embodiment of the invention.

FIG. 2 illustrates a first exemplary embodiment of the invention by implementing the circuit shown in FIG. 1 into an integrated circuit. FIG. 2 illustrates a top view of the surface of a substrate 5. A plurality of structured metallization layers or patches has been applied to the substrate surface, which define the basic structure of the integrated circuit. FIGS. 3 to 8 illustrate different section views through the semiconductor device. The position of these section views is illustrated in FIG. 2 and partly in FIGS. 9 to 12 as well, which show further exemplary embodiments of the invention.

As can be best understood from FIG. 2, the second source contact 22 has been implemented by two surface areas 52a and 52b which define the outermost boundary of the planar structure of the component. Adjacent and symmetrically thereto, two surface areas 51a and 51b have been arranged which can be used as both the first drain contact 11 and the second drain contact 21. As a result, no further connection lines between the drain contacts are needed, thereby eliminating parasitic inductances and capacitances associated with such connection lines. Surface areas 51a and 51b are connected to an optional third surface area 51c by means of associated bridge contacts 55 to provide a single output contact of the integrated circuit.

The surface areas 51b and 51a surround a surface area 56, which in turn has a dual function as a first source contact 12 and a second gate contact 23. Again, no additional connection line connecting the first source contact 12 and the second gate contact 23 is needed, thereby eliminating parasitic inductances and capacitances associated with such connection lines.

Figure 3:
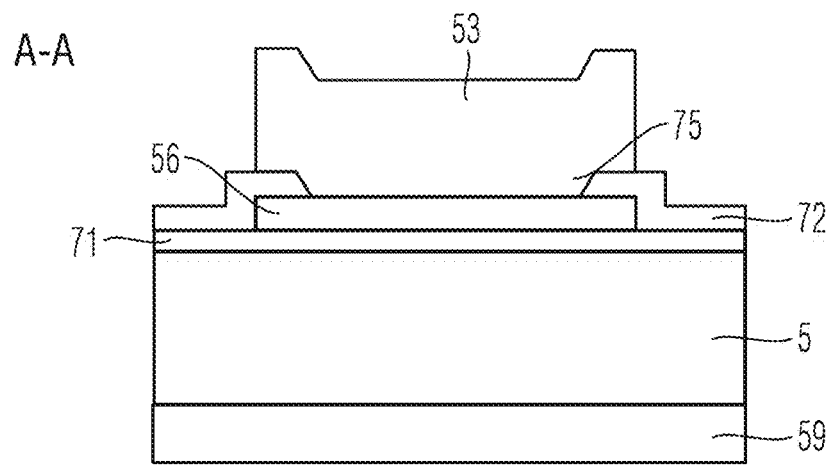
FIG. 3 illustrates a cross sectional view along the line A-A of an integrated circuit according to the invention.

Some of the metallization layers may have a greater thickness, which may be obtainable in some embodiments by electroplating, as shown in more detail in FIG. 3 illustrating the cross section along the line A-A. Such a metallization layer having increased thickness may be used to implement the first source contact 12. The metallization layer may have a thickness ranging from about 200 nm to about 3 µm.

Figure 5:
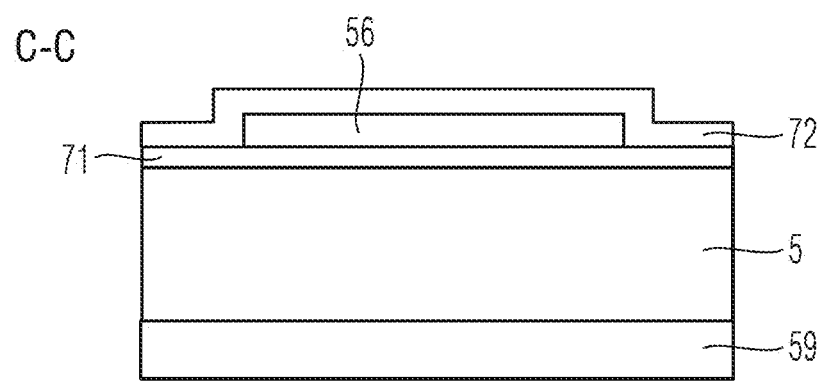
FIG. 5 illustrates a cross sectional view along the line C-C of an integrated circuit according to the invention.

Some of the metallization layers of the integrated circuit 5 have a lower layer thickness, which may be obtainable in some embodiments by sputtering or physical vapor deposition (PVD), as shown in more detail in FIG. 5 illustrating the cross section along the line C-C. Such a metallization layer having reduced thickness may have a thickness ranging from about 20 nm to about 150 nm or from about 20 nm to about 500 nm.

Figure 4:
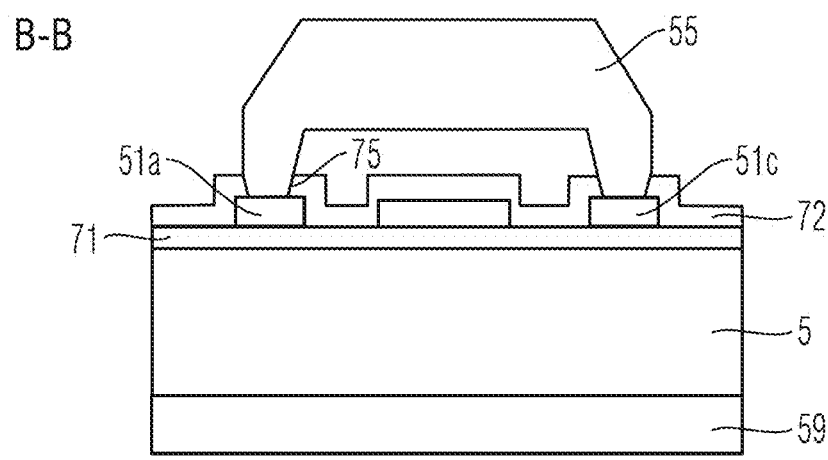
FIG. 4 illustrates a cross sectional view along the line B-B of an integrated circuit according to the invention.

Some of the metallization layers are stacked to guide electrical signals at different levels. Such stacked metallization layers are referred as bridge contacts within the meaning of the present description. Such bridge contacts are illustrated in more detail in FIG. 4 illustrating the cross section along the line B-B.

Figure 6:
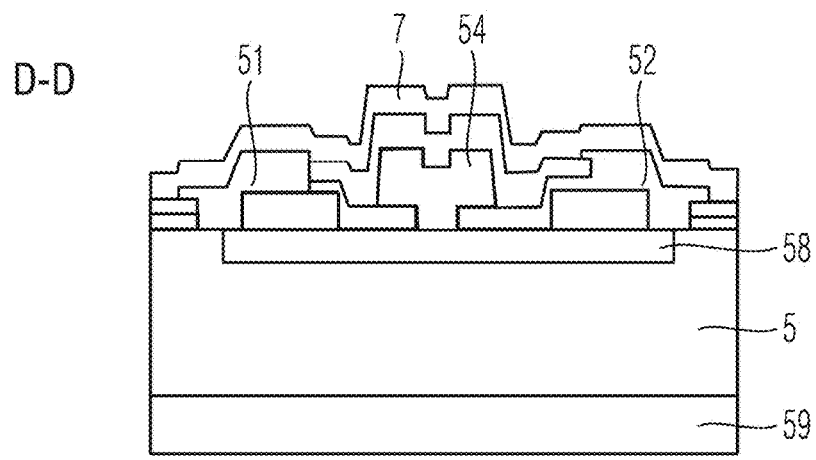
FIG. 6 illustrates a cross sectional view along the line D-D of an integrated circuit according to the invention.
Figure 7:
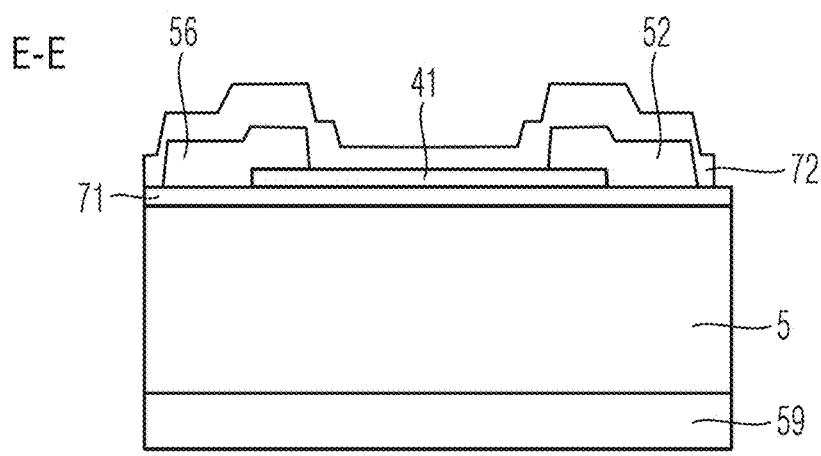
FIG. 7 illustrates a cross sectional view along the line E-E of an integrated circuit according to the invention.

A gate contact is illustrated in more detail in FIG. 6 illustrating the cross section along the line D-D. A resistor 41 usable in the direct current path 4 is illustrated in more detail in FIG. 7 illustrating the cross section along the line E-E.

Turning now to FIG. 3, a metallization layer 53 is shown in greater detail. FIG. 3 illustrates a cross sectional view of the integrated circuit according to the invention along the line A-A. FIG. 3 shows a substrate 5, which may comprise, for example, $Al_2O_3$ and/or SiC and/or Si and/or a group-III-nitride. The group-III-nitride comprises a binary, ternary or quaternary compound of at least one element of the third main group of the periodic table of the elements and nitrogen. The substrate 5 may have a multilayer structure and may, for example, be designed as a semiconductor heterostructure or comprise such a semiconductor heterostructure which is obtainable by means of MBE, MOVPE, MOCVD or other methods known in the art.

The substrate 5 has a bottom side which may be provided with an optional metallization layer 59. This metallization layer 59 may be used as an electrical contact of the substrate 5 and may be coupled to a reference potential when the integrated circuit is in use.

The top side of the substrate 5 is arranged opposite to the bottom side. The top side is shown in FIG. 2. Said top side may be provided with a first dielectric 71, comprising in some embodiments silicon nitride, silicon oxide, silicon oxynitride, or a polymer such as benzocyclobutene. The first dielectric 71 may have a thickness ranging from about 5 nm to about 20 nm. In other embodiments, the first dielectric 71 may have a thickness ranging from about 20 nm to about 300 nm.

On the first dielectric 71, a structured metallization layer 56 is arranged as a thin film. Said metallization layer 56 may have a thickness ranging from about 2 nm to about 20 nm in some embodiments. In other embodiments, the metallization layer 56 may have a thickness ranging from about 5 nm to about 25 nm. In still other embodiments, the metallization layer 56 may have a thickness ranging from about 25 nm to about 1000 nm. In still other embodiments, the metallization layer 56 may have a thickness ranging from about 250 nm to about 600 nm. As shown in FIG. 5, this thin film metallization layer may be sufficient for generating electric fields within the substrate 5 and thereby influence the charge carrier density in an active semiconductor layer. Furthermore, said thin film metallization layer may be sufficient to conduct electrical signals with low electrical power within the plane defined by the substrate 5.

As further detailed in FIG. 3 and FIG. 5, the thin film metallization layer 56 may be provided with an optional second dielectric 72. Said second dielectric 72 may act as a passivation layer preventing oxidation of the thin film metallization layer 56. The second dielectric 72 may be composed from a nitride, an oxide, an oxinitride, or a polymer. In some embodiments, silicon nitride, silicon oxide, silicon oxinitride, or benzocyclobutene may be used for the second dielectric 72.

FIG. 3 illustrates the reinforcement of the thin film metallization layer 56 by adding additional material to the thin film metallization. This feature may increase the cross-sectional area of the conductor. This larger cross-section may allow for a higher current flowing along the conductor, thereby increasing the maximum output power. As can be seen in the figures, the second dielectric 72 is partially removed to create an opening 75. Removal of the dielectric may be done by wet or dry chemical etching. A thick film metallization layer 53 is deposited after partial removal of the dielectric layer 72. Metal deposition may be done by any of a sputtering process, thermal vapor deposition, electroplating, electroless metallization process or the like. The thick film metallization layer 53 may be structured to the shape shown in FIG. 2 either by masking and etching subsequent to the deposition or by masking prior to the deposition and partial deposition of the metal layer. The total thickness of the thick film metallization layer 53 may be selected from about 200 nm to about 30 µm in some embodiments of the invention.

FIG. 4 exemplarily illustrates the design of a bridge contact by showing a cross section along the line B-B. Like reference numerals refer to identical or functionally similar elements, so that the following description is limited to the parts not explained elsewhere. As can be seen from FIG. 4, the bridge contact 55 has a first end and a second end. Each end is connected to a thin film metallization layer 51a and 51c, which in turn is deposited on a first dielectric layer 71 and covered by a second dielectric layer 72. The second dielectric layer 72 is partially removed to provide openings 75 in order to expose the surface of the thin film metallization layers 51a and 51c. The bridge contact 55 extends from the first thin film metallization layer 51a to the second thin film metallization layer 51c without touching the second dielectric 72, so that further metallization layers or signal layers may be guided below the bridge contact 55.

FIG. 6 illustrates the design of a gate contact 54. As shown in FIG. 6, the substrate 5 comprises a semiconductor heterostructure 58 comprising a plurality of epitaxial layers having different dopant concentration and/or being composed from different semiconductor materials. In some embodiments of the invention, the semiconductor heterostructure 58 is configured to allow the formation of a two-dimensional electron gas at least during operation of the integrated circuit. The semiconductor heterostructure 58 is contacted by metallic contacts 51 and 52. The metallic contacts 51 and 52 may be implemented as ohmic contacts to the semiconductor heterostructure 58. As a protection against oxidation, the metallic contacts 51 and 52 may be covered with one or more dielectric layers 7. The metallic contacts 51 and 52 may be configured to be used as source and drain contacts 11, 21, 22, 12 of a field effect transistor.

A gate finger 54 is arranged between the source and drain contacts on the surface of the substrate 5. This gate finger 54 is shown in FIG. 2 in a top view and in FIG. 6 in a cross sectional view. The gate contact 23 may be arranged on the top of the semiconductor heterostructure 58, so that the semiconductor heterostructure 58 is exposed to an electric field when a voltage is applied to the gate contact 23. This electrical field may induce a band bending inside the semiconductor heterostructure 58, thereby triggering the formation or depletion of a two-dimensional electron gas (2DEG) and, as a result, the electrical conductivity. In some embodiments, the semiconductor heterostructure 58 may be a part of a high electron mobility transistor (HEMT). In some embodiments, the gate finger 54 can be arranged directly on the semiconductor surface and form a Schottky contact, resulting in the formation of a metal-semiconductor FET (MESFET). In still other embodiments of the invention, the gate finger 54 can be separated from the semiconductor surface by an optional insulating layer, thereby forming a metal-oxide-semiconductor FET (MOSFET). Such an insulating layer has the effect that an electrical current from the gate contact into the channel is avoided. In further embodiments of the invention, the concept of a MOSFET and a HEMT can be combined to form a MOSHEMT.

In order to avoid oxidation and to increase long-term stability, the gate finger 54 can be covered by further optional dielectric layers 7.

The implementation of a thin film resistor 41 is explained with reference to FIG. 7. Such a thin film resistor 41 may be part of the direct current path 4 as explained previously with reference to FIG. 2. The thin film resistor 41 is electrically insulated from the substrate 5 and protected against the atmosphere by first and second dielectric layers 71 and 72, respectively. The cross-sectional area of the conductor forming the thin film resistor influences the electrical resistance and may be controlled during manufacturing by selection of the material, the surface area and the layer thickness, so that predeterminable values for the resistance of the direct current path 4 can be obtained. The electrical contacts are implemented by metallization layers 56 and 52, which may have any of a larger cross-section and/or a lower specific resistance.

Figure 9:
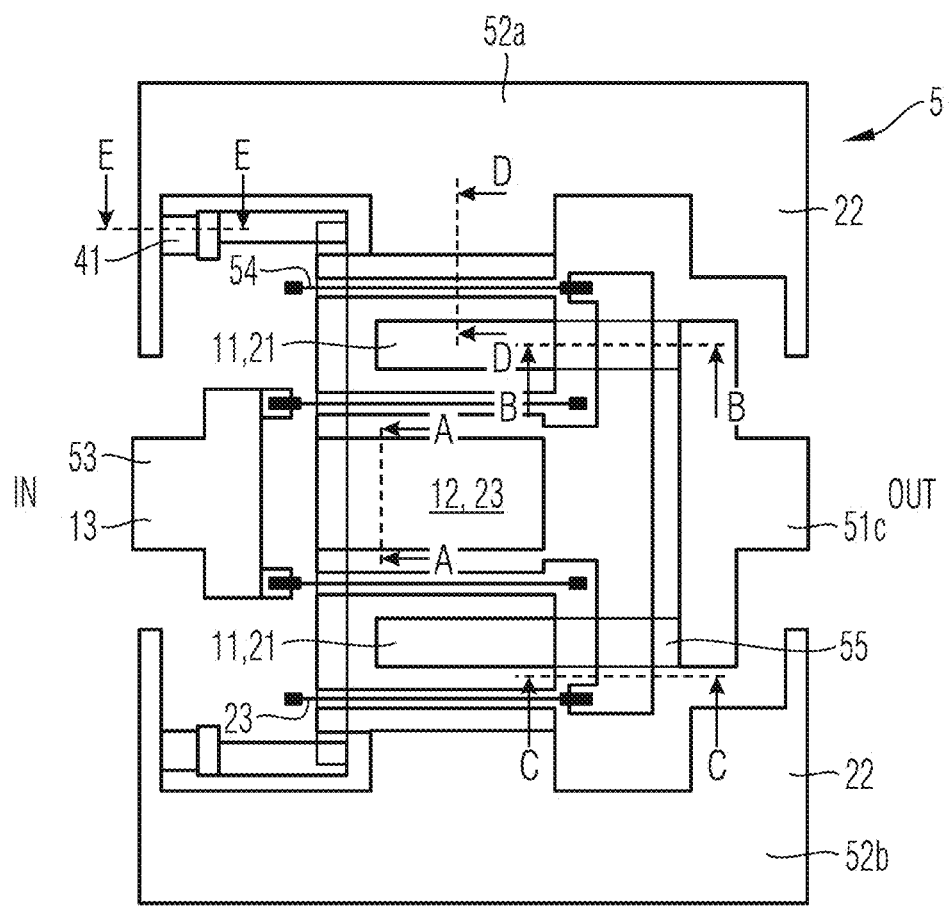
FIG. 9 illustrates a top view of an integrated circuit according to a second embodiment of the invention.

FIG. 9 illustrates an integrated circuit according to a second exemplary embodiment of the invention. Like reference numerals refer to identical or functionally similar elements, so that the following description is focused on the main differences to the first embodiment explained previously. As may be seen from a comparison between FIG. 9 and FIG. 2, one difference between the first and second embodiments relates to the position of the direct current path. In the second embodiment, the resistor 41 is coupled to the first source contact by a bridge contact, whereas in the first embodiment shown in FIG. 2 a direct connection within the plane defined by the substrate is implemented between the first source contact 12 and the second source contact 22.

Figure 19:
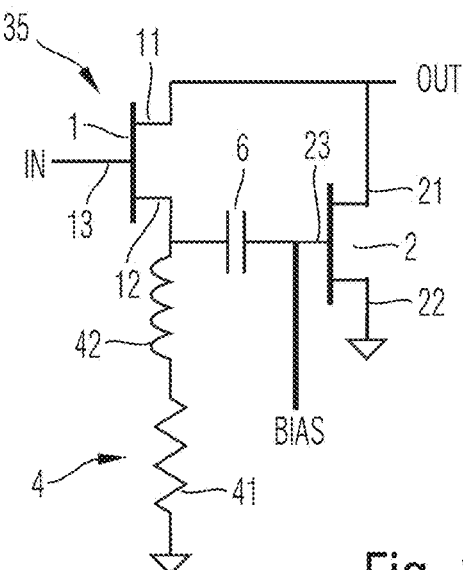
FIG. 19 illustrates a circuit diagram of the integrated circuit according to the third and fourth embodiments
Figure 10:
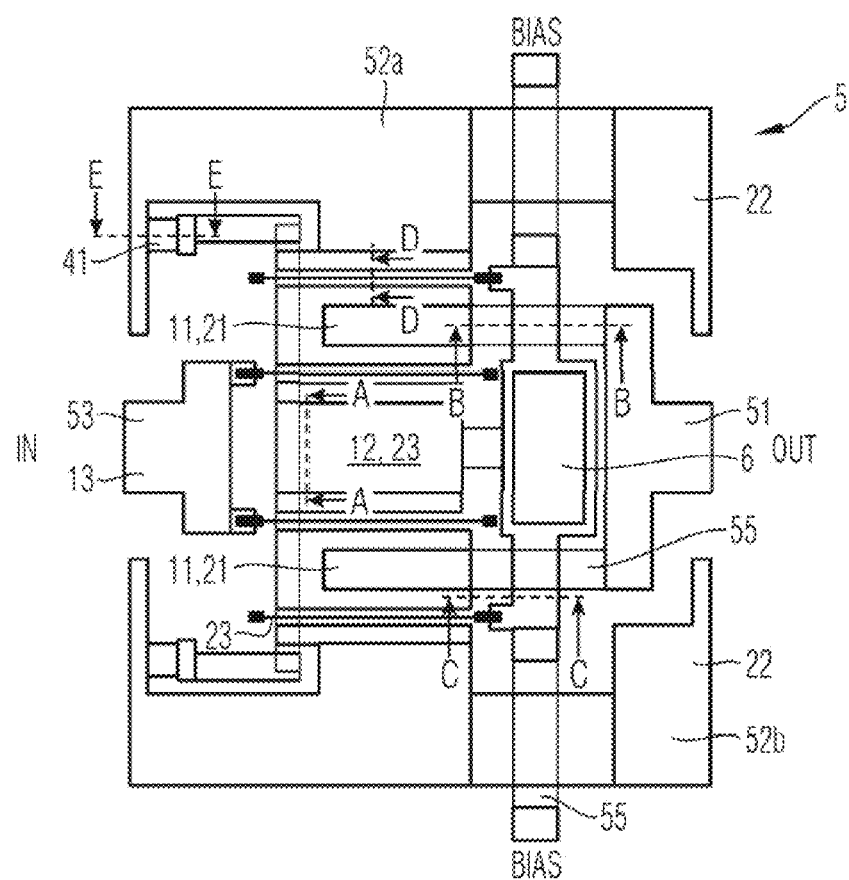
FIG. 10 illustrates a top view of an integrated circuit according to a third embodiment of the invention.

FIG. 10 illustrates an integrated circuit according to a third exemplary embodiment of the invention. The circuit diagram of the integrated circuit according to the third exemplary embodiment is shown in FIG. 19, where like reference numerals refer to identical or functionally similar elements, so that the following description is focused on the main differences to the other embodiments explained previously. The third embodiment comprises further a capacitor 6 having two connectors being connected to the first source contact 12 and the second gate contact 23 respectively. This capacitor blocks a direct current between the first field effect transistor and the second field effect transistor so that a bias voltage can be applied to at least one bias contact which is connected to the second gate terminal 23 by means of bridge contacts 55. A cross-sectional view of the capacitor 6 is shown in FIG. 8.

Figure 8:
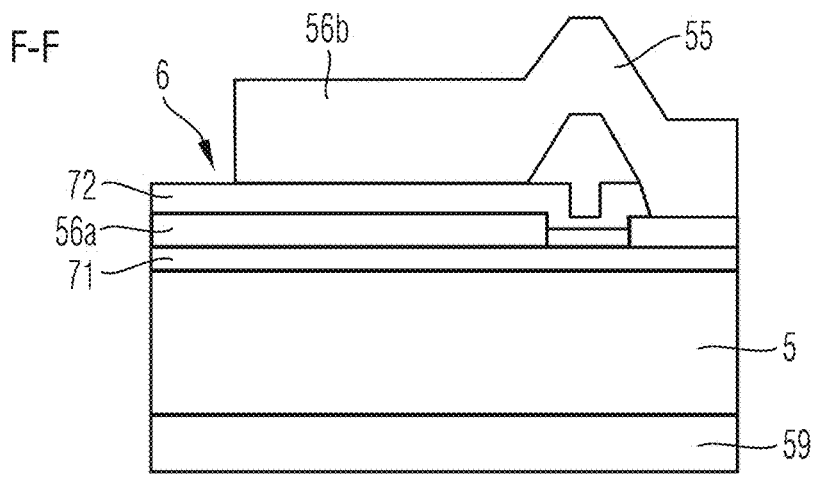
FIG. 8 illustrates a cross sectional view along the line F-F of an integrated circuit according to the invention.

Looking now at FIG. 8, it becomes apparent that the capacitor 6 is separated from the substrate 5 by a first dielectric layer 71. The capacitor 6 itself comprises two metallization layers 56a and 56b, which are separated from one another by a second dielectric layer 72. Thus, the two metallization layers 56a and 56b and the second dielectric layer 72 form a plate capacitor. The upper metallization layer 56b is connected to the first source contact 12 by a bridge contact 55.

Figure 11:
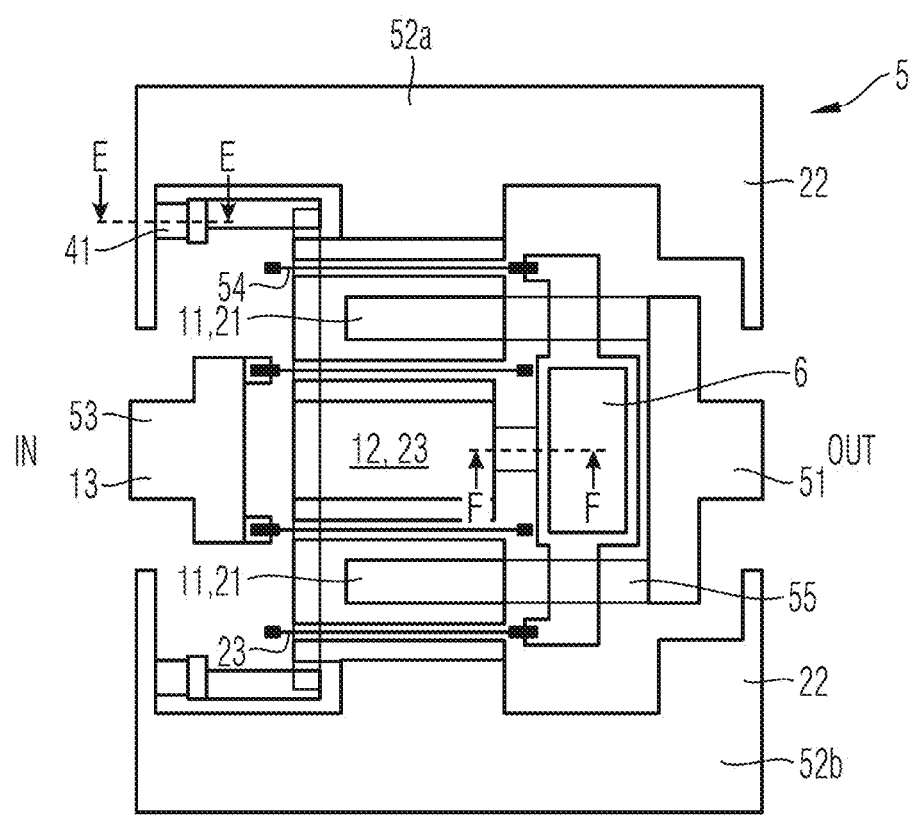
FIG. 11 illustrates a top view of an integrated circuit according to a fourth embodiment of the invention.

FIG. 11 illustrates an integrated circuit according to a fourth exemplary embodiment of the invention. Like reference numerals refer to identical or functionally similar elements, so that the following description is focused on the main differences to the other embodiments explained previously. The fourth embodiment differs from the third embodiment by the absence of the bias connections. The second gate contact and the first source contact are coupled by means of a resistor which is arranged in parallel to a capacitor 6, thereby forming a direct current path between the second gate contact and the first source contact.

Figure 12:
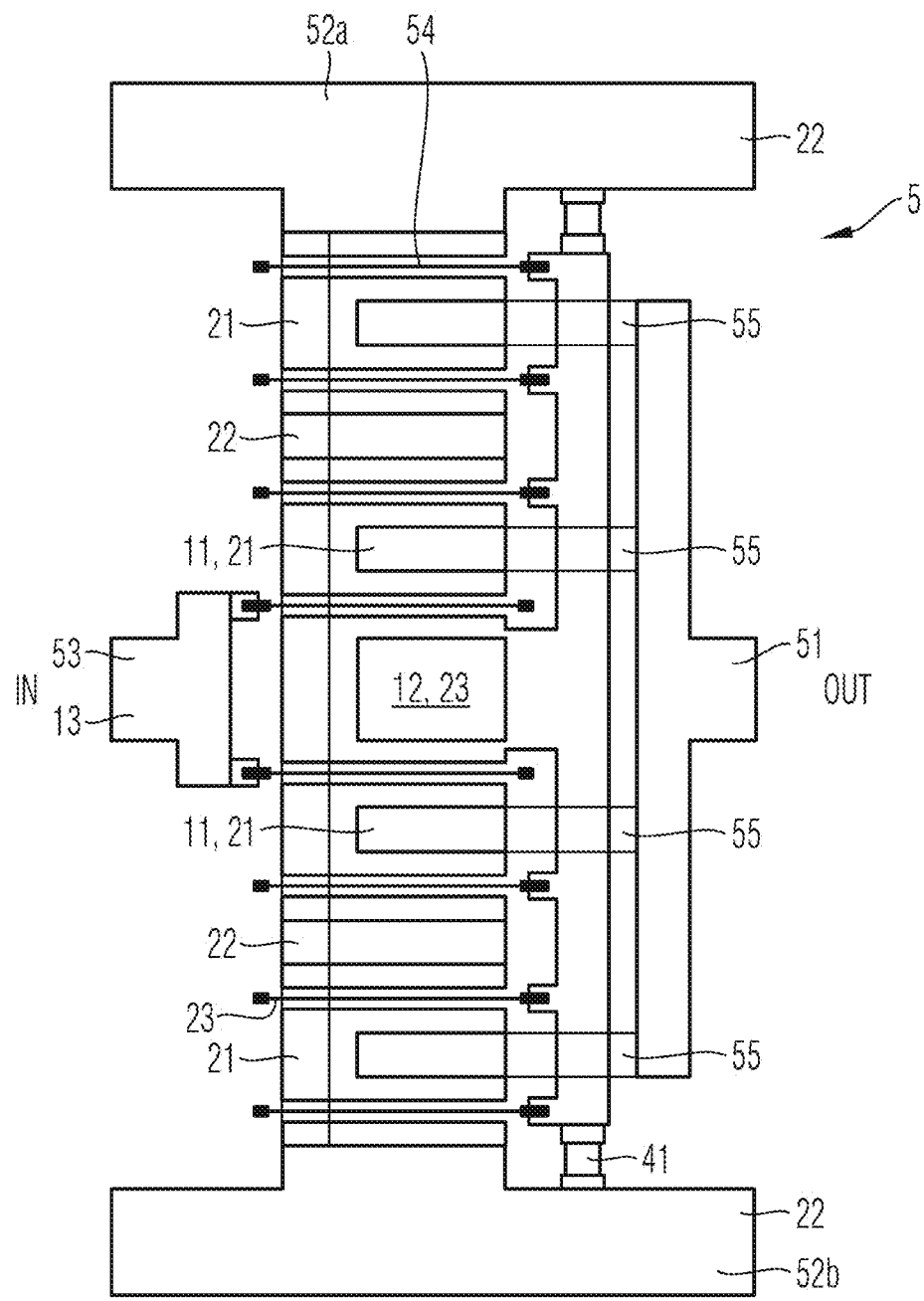
FIG. 12 illustrates a top view of an integrated circuit according to a fifth embodiment the invention.

FIG. 12 illustrates an integrated circuit according to a fifth exemplary embodiment of the invention. Like reference numerals refer to identical or functionally similar elements, so that the following description is focused on the main differences to the other embodiments explained previously. The fifth embodiment differs from the first embodiment in that the number and the area of the metallization layers of the second drain contacts 21 and the second source contacts 22 are higher than the number and the area of the first drain contact 11 and of the first source contact 12. This feature allows the second field effect transistor to contribute a higher percentage of the output power than the first field effect transistor, so that the total output power of the integrated circuit may be increased. As the parasitic input capacitances, i.e. the gate-source capacitance of both field effect transistors are connected in series, the smaller capacitance is the dominant one. Therefore, when connecting a smaller first field effect transistor to a larger second field effect transistor, the effective input capacitance of the structure is dominated by the smaller value of the first field effect transistor. Therefore, a relatively large structure with high output power can be driven with a low input capacitance, which may be advantageous for high frequency operation with high bandwidths.

Figure 13:
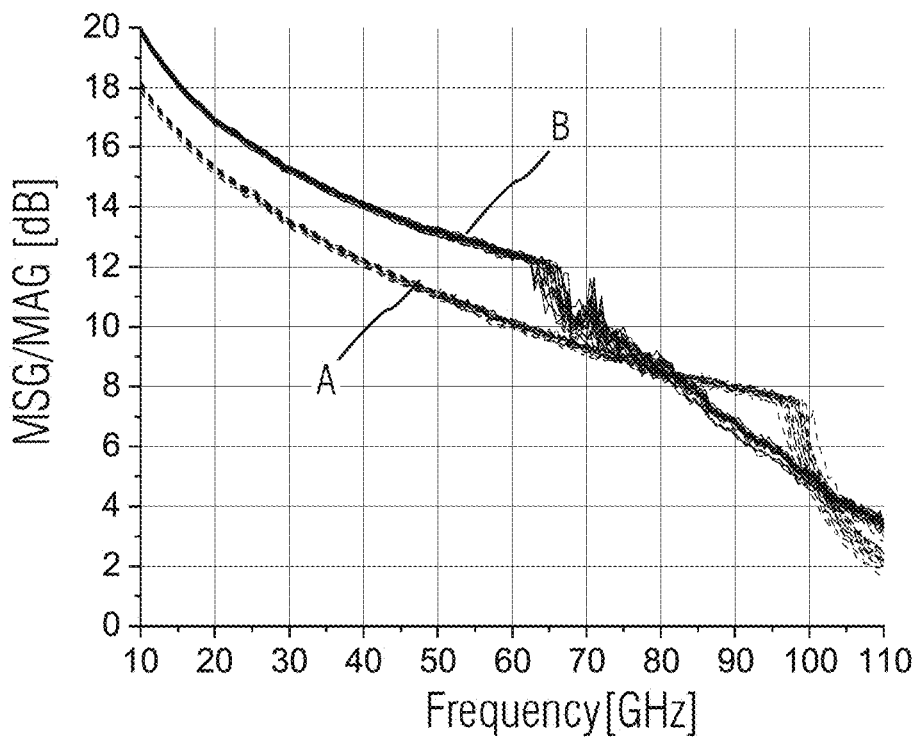
FIG. 13 illustrates the maximum stable gain (MSG) and the maximum available gain (MAG) of an integrated circuit according to the invention versus the frequency.
Figure 14:
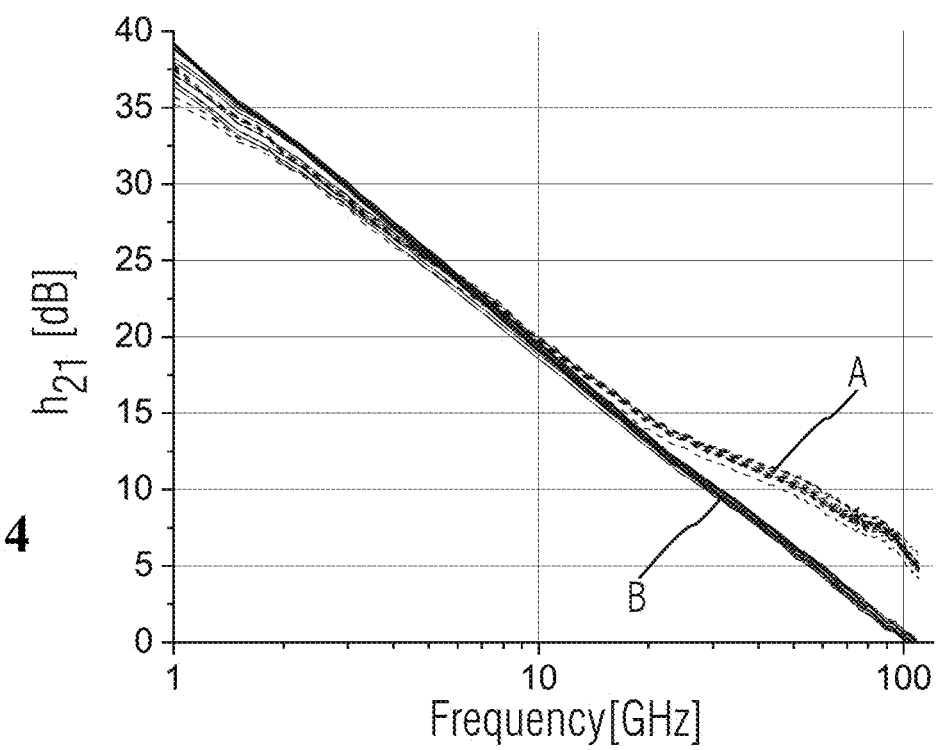
FIG. 14 illustrates the current gain of an integrated circuit according to the invention versus the frequency.

FIGS. 13 and 14 are used to compare the performance of an integrated circuit according to the invention with the performance of a known field effect transistor in common source topology. Thus, FIGS. 13 and 14 illustrate advantages which may be available in some embodiments of the invention.

FIG. 13 illustrates the maximum stable gain and the maximum available gain in dB on the vertical axis and the frequency on the horizontal axis. As known to those skilled in the art, the gain of a field effect transistor may be divided into two ranges:

1. The maximum stable gain (MSG), where the field effect transistor is usable for stable operation under certain conditions. In the range of maximum stable gain, the gain decreases by about 10 dB per decade as the frequency increases.
2. Above a threshold frequency, the MSG changes to the maximum available gain (MAG), where the field effect transistor shows absolutely stable operating conditions. In the range of maximum available gain, the gain decreases by about 20 dB per decade as the frequency increases.

Having explained the basic principles of FIG. 13, graph A shows that the threshold frequency between MSG and MAG for the integrated circuit according to the invention is located at an operating frequency of about 100 GHz. Graph B shows that the threshold frequency between MSG and MAG for a known single field effect transistor in common source topology is located at an operating frequency of about 65 GHz. Thus, the integrated circuit according to the invention allows for a higher gain between 80 and 100 GHz than the known field effect transistor in common source topology.

FIG. 14 shows the current gain in dB on the vertical axis and the frequency on the horizontal axis. A sine signal is applied to the input and the output is short-circuited. The cutoff frequency is defined as the frequency at which the current gain of the integrated circuit reaches the value unity or 1 or 0 dB, i.e. the graphs intersect the x-axis. Graph B illustrates the current gain of a known single field effect transistor in common source topology. As can be seen from graph B in FIG. 14, the cutoff frequency is about 100 GHz. Graph A illustrates the current gain of an integrated circuit according to the invention. As can be seen from graph A in FIG. 14, the cutoff frequency is about 200 GHz. Thus, the integrated circuit according to the invention allows for a much higher cutoff frequency, which is approximately doubled in the illustrated exemplary embodiment.

Figure 15:
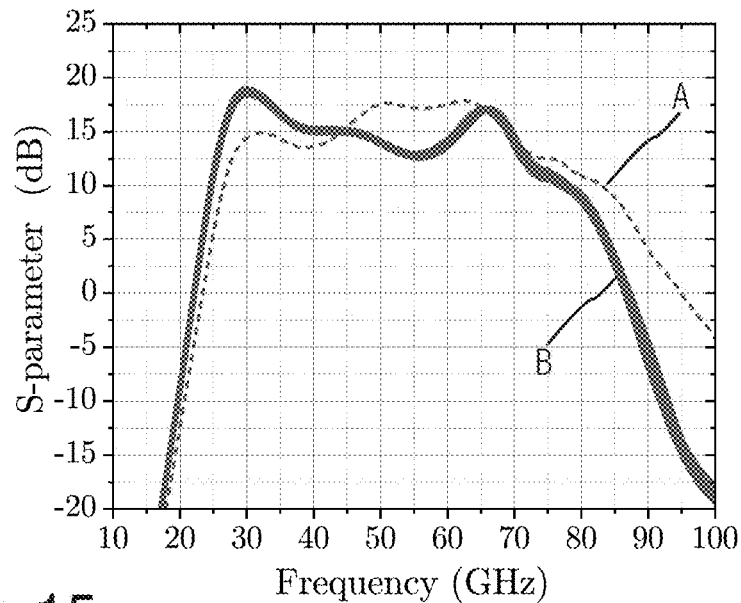
FIG. 15 illustrates the small-signal behavior of an integrated circuit according to the third embodiment of the invention versus the frequency.

FIG. 15 illustrates the small-signal behavior on the vertical axis and the frequency on the horizontal axis of an integrated circuit according to the third illustrative example of the invention shown in FIG. 10. The figure shows the scattering parameter or S-parameter between the output and the input on the vertical axis. The S-parameter describes the electrical behavior of the circuit under stationary conditions. Graph B shows measured values of the S-parameter for 11 nominally identical integrated circuits according to the invention. Graph A shows the calculated S-parameter for an integrated circuits according to the invention. The minor deviations of graph B show that nominally identical circuits show nearly identical behavior. The manufacturing process for the integrated circuits shows an excellent reproducibility.

The integrated circuit 35 according to the invention provides a small signal gain ($S_{21}$) of more than 13 dB over a frequency range from about 26 GHz to about 71 GHz. This corresponds to an operating bandwidth of 92.8% or 1.45 octaves. FIG. 15 shows that the integrated circuit 35 according to the invention is capable of full coverage of several millimeter wavebands, including the Ka band (26-40 GHz), the Q band (33-50 GHz), the U band (40-60 GHz), and virtually the entire V band (50-75 GHz).

Figure 16:
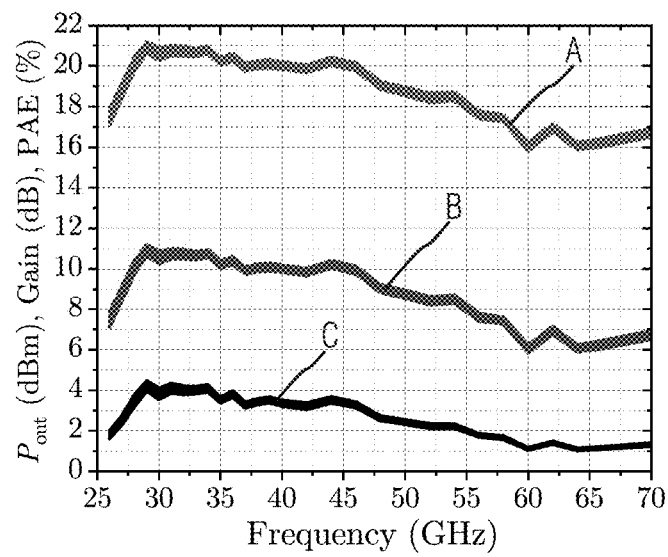
FIG. 16 illustrates the large-signal behavior of an integrated circuit according to the third embodiment of the invention versus the frequency.

FIG. 16 illustrates the large-signal behavior on the vertical axis and the frequency on the horizontal axis of an integrated circuit according to the third illustrative example of the invention shown in FIG. 10. Graph A illustrates the output power, graph B the gain and graph C the power-added efficiency. The measured values shown in FIG. 16 were determined by applying a constant input signal amplitude of 10 dBm. Graphs A, B, and C each show measured values for 11 nominally identical integrated circuits according to the invention. The minor deviations show that nominally identical circuits show nearly identical behavior. The manufacturing process for the integrated circuits shows an excellent reproducibility.

FIG. 16 discloses that the integrated circuit 35 according to the invention provides an output power in the range from 16 dBm to 21.2 dBm over a frequency range from about 26 GHz to about 70 GHz, with an average value of 19 dBm. The respective power-added efficiency, i.e. the ratio of the difference between the output power and the input power to the DC power drawn from the supply voltage, is between about 1% and about 4.5%.

Figure 17:
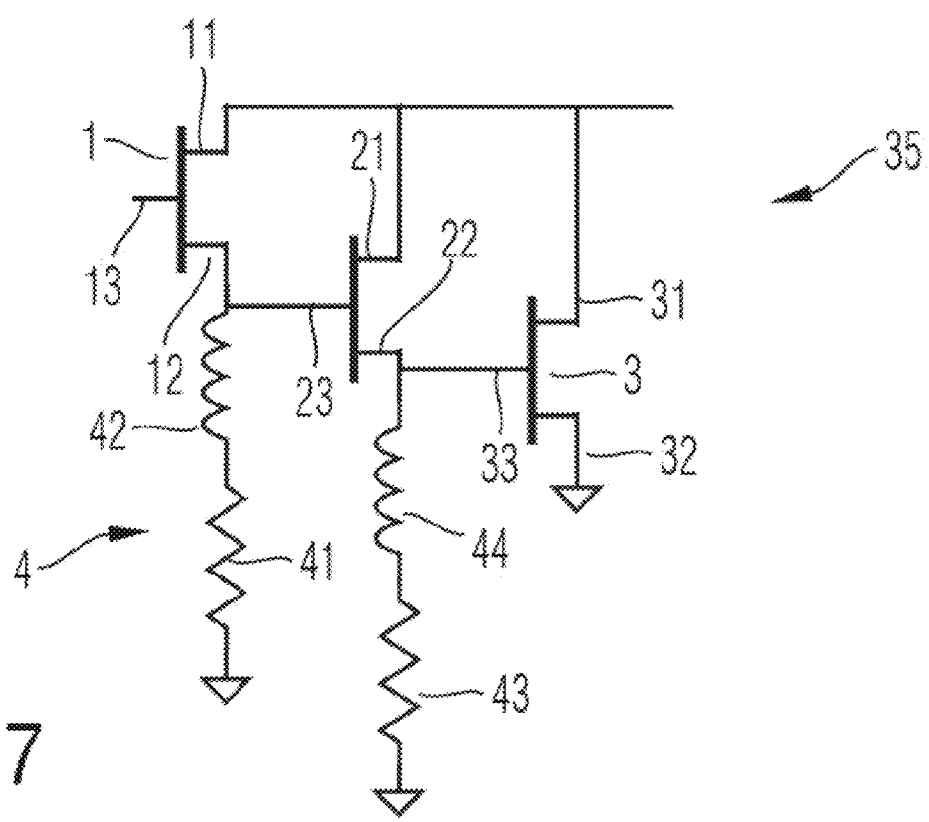
FIG. 17 illustrates a circuit diagram of an integrated circuit according to a sixth embodiment of the invention.

FIG. 17 illustrates a circuit diagram of the integrated circuit according to a sixth embodiment. Like reference numerals refer to identical or functionally similar elements, so that the following description is focused on the main differences to the other embodiments explained previously. The circuit comprises at least one first field effect transistor 1 and at least one second field effect transistor 2 as well as at least one third field effect transistor 3. The first field effect transistor 1 has a first drain contact 11 and a first source contact 12. The first drain contact 11 and the first source contact are adjacent to a channel, the conductivity of which can be controlled on the basis of a gate voltage which can be applied to the first gate contact 13.

The second field effect transistor 2 has a second drain contact 21 and a second source contact 22. Furthermore, the second field effect transistor 2 has a second gate contact 23 as known in the art.

The third field effect transistor 3 has a third drain contact 31 and a third source contact 32. In addition, the third field effect transistor 3 has a third gate contact 33 as known in the art.

The third source contact 32 is connected to a reference potential, e.g. an earth potential or a ground potential. The third gate contact 33 is coupled to the second source contact 22. The second gate contact 23 is coupled to the first source contact 12. The first gate contact 13 is configured to be used as an input of the amplifier circuit 35. The three drain contacts 11, 21 and 31 are connected to each other and are configured to be used as an output of the amplifier circuit.

When an input voltage is applied to the first gate contact 13, the channel between the first source contact 12 and the first drain contact 11 becomes conductive, so that a gate voltage is applied at the second gate contact 23. The gate voltage at the second gate contact 23 causes the channel between the second source contact 22 and the second drain contact 21 to become conductive, so that a gate voltage is applied at the third gate contact 33. The gate voltage at the third gate contact 33 causes the channel between the third source contact 32 and the third drain contact 31 to become conductive, so that an output signal is generated at the output.

When switching the gate voltage below the switching threshold at the first gate contact 13, the channel between the first source contact 12 and the first drain contact 11 depletes and becomes high-resistive. Accumulated charge at the second gate contact 23 is dumped to ground by means of the resistor 41 and the serially connected inductor 42. This causes the gate voltage at the second gate contact 23 to vanish and the channel between the second source contact 22 and the second drain contact 21 depletes and becomes high-resistive. Accumulated charge at the third gate contact 33 is dumped to ground by means of the resistor 43 and the serially connected inductor 44. This causes the gate voltage at the third gate contact 33 to vanish and the channel between the third source contact 32 and the third drain contact 31 depletes and becomes high-resistive, so that the output signal at the output drops to zero.

In the same way as explained for a 2-stage or 3-stage amplifier on the basis of FIGS. 1 and 17 people familiar in the field will realize that additional stages can be added to the amplifier circuit with an even higher number of field-effect transistors or amplifier stages.

Figure 18:
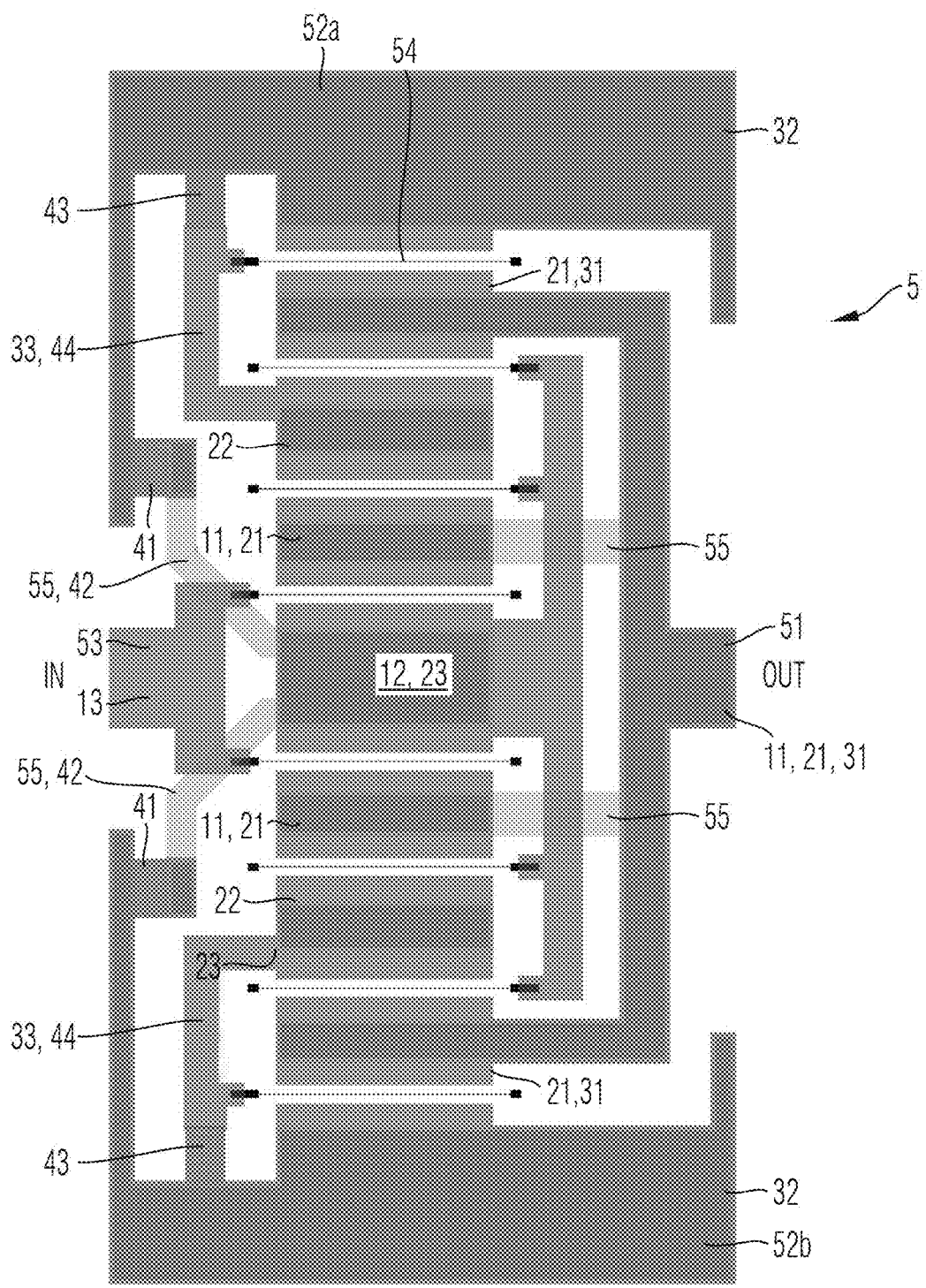
FIG. 18 illustrates a top view of an integrated circuit according to the sixth embodiment of the invention.

FIG. 18 illustrates the implementation of the circuitry explained with reference to FIG. 17 onto a single substrate of an integrated circuit. FIG. 18 illustrates the top view onto an integrated circuit according to a sixth embodiment of the invention. Like reference numerals refer to identical or functionally similar elements, so that the following description is focused on the main differences to the other embodiments explained previously.

The sixth embodiment differs from the first to fifth embodiments described above in that the number of field effect transistors and thus the area of the source contacts, the gate contacts and the drain contacts is increased, as described in connection with FIG. 17. This leads to a further decreasing input capacitance, so that the operating frequency and/or the bandwidth may be increased further in some embodiments.

It is noted that various individual features of the inventive processes and systems may be described only in one exemplary embodiment herein. The particular choice for description herein with regard to a single exemplary embodiment is not to be taken as a limitation that the particular feature is only applicable to the embodiment in which it is described. All features described herein are equally applicable to, additive, or interchangeable with any or all of the other exemplary embodiments described herein and in any combination or grouping or arrangement. In particular, use of a single reference numeral herein to illustrate, define, or describe a particular feature does not mean that the feature may not be associated or equated to another feature in another drawing figure or description. Further, where two or more reference numerals are used in the figures or in the drawings, this should not be construed as being limited to only those embodiments or features, as they are equally applicable to similar features whether or not a reference numeral is used or another reference numeral is omitted.

The foregoing description and accompanying drawings illustrate the principles, exemplary embodiments, and modes of operation of the systems, apparatuses, and methods. However, the systems, apparatuses, and methods should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments may be made by those skilled in the art without departing from the scope of the systems, apparatuses, and methods as defined by the following claims.

What is claimed is:

1. An fT-doubler amplifier integrated circuit having a high gain-bandwidth product comprising:
   at least one first field effect transistor of the fT-doubler amplifier integrated circuit, having at least one first source contact and at least one first drain contact and at least one first gate contact, and
   at least one second field effect transistor of the fT-doubler amplifier integrated circuit, having at least one second source contact and at least one second drain contact and at least one second gate contact,
   wherein the first drain contact is connected to the second drain contact, and
   the first source contact is coupled to the second gate contact,
   wherein the first source contact, the first drain contact, the first gate contact, the second source contact, the second drain contact and the second gate contact are implemented as structured metallization layers on a single substrate,
   the first and second drain contacts share at least one single dedicated surface area on said substrate, and
   the first source contact and the second gate contact share one single dedicated surface area on said substrate.

2. The fT-doubler amplifier integrated circuit according to claim 1, wherein said substrate comprises at least one material selected from the group consisting of $Al_2O_3$ and SiC and Si and a group-III-nitride and a III-V compound semiconductor and a II-VI compound semiconductor.

3. The fT-doubler amplifier integrated circuit according to claim 1, wherein the first and second drain contacts are configured as a signal output and the first gate contact is configured as a signal input.

4. The fT-doubler amplifier integrated circuit according to claim 1, comprising further a direct current path having a first end and a second end, wherein the first end is connected to the second gate contact and the second end is connected to a reference potential.

5. The fT-doubler amplifier integrated circuit according to claim 1, wherein the first and second drain contacts share two dedicated surface areas on said substrate, which are arranged on opposite sides of the surface area of the first source contact.

6. The fT-doubler amplifier integrated circuit according to claim 5, wherein at least two second source contacts are arranged adjacent to the surface areas of said first and second drain contacts and on the sides of the surface areas of the first and second drain contacts facing away from the first source contact.

7. The fT-doubler amplifier integrated circuit according to claim 4, wherein the direct current path comprises any of at least one resistor and/or at least one inductor.

8. The fT-doubler amplifier integrated circuit according to claim 1, comprising further at least one capacitor having two connectors being connected to the first source contact and the second gate contact, respectively.

9. An fT-doubler amplifier integrated circuit, comprising at least one first field effect transistor of the fT-doubler amplifier integrated circuit, having at least one first source contact and at least one first drain contact and at least one first gate contact, and at least one second field effect transistor of the fT-doubler amplifier integrated circuit, having at least one second source contact and at least one second drain contact and at least one second gate contact, wherein the first drain contact is connected to the second drain contact, and the first source contact is coupled to the second gate contact, wherein the first source contact, the first drain contact, the first gate contact, the second source contact, the second drain contact and the second gate contact are implemented as structured metallization layers on a single substrate, and wherein the first and second drain contacts share at least one single dedicated surface area on said substrate, wherein the first and second drain contacts are configured as a single signal output and the first gate contact is configured as a signal input, wherein the first source contact and the second gate contact share one single dedicated surface area on said substrate, and wherein the first and second drain contacts share two dedicated surface areas on said substrate, which are arranged on opposite sides of the surface area of the first source contact.

10. The fT-doubler amplifier integrated circuit according to claim 9, comprising further a direct current path having a first end and a second end, wherein the first end is connected to the second gate contact and the second end is connected to a reference potential.

11. The fT-doubler amplifier integrated circuit according to claim 9, wherein at least two second source contacts are arranged adjacent to the surface areas of said first and second drain contacts and on the sides of the surface areas of the first and second drain contacts facing away from the first source contact.

12. The fT-doubler amplifier integrated circuit according to claim 9, comprising further at least one capacitor having two connectors being connected to the first source contact and the second gate contact, respectively.

13. The fT-doubler amplifier integrated circuit according to claim 9, wherein the first source contact and the second gate contact share one single dedicated surface area on said substrate.

14. An electronic device comprising at least one fT-doubler amplifier integrated circuit, said fT-doubler amplifier integrated circuit comprising at least one first field effect transistor of the fT-doubler amplifier integrated circuit, having at least one first source contact and at least one first drain contact and at least one first gate contact, and at least one second field effect transistor of the fT-doubler amplifier integrated circuit, having at least one second source contact and at least one second drain contact and at least one second gate contact, wherein the first drain contact is connected to the second drain contact, and the first source contact is coupled to the second gate contact, wherein the first source contact, the first drain contact, the first gate contact, the second source contact, the second drain contact and the second gate contact are implemented as structured metallization layers on a single substrate, and wherein the first and second drain contacts share at least one single dedicated surface area on said substrate, and wherein the first and second drain contacts are configured as a single signal output and the first gate contact is configured as a signal input, and the first source contact and the second gate contact share one single dedicated surface area on said substrate.

15. The electronic device according to claim 14, comprising further a direct current path having a first end and a second end, wherein the first end is connected to the second gate contact and the second end is connected to a reference potential.

16. The electronic device according to claim 14, wherein the first and second drain contacts share two dedicated surface areas on said substrate, which are arranged on opposite sides of the surface area of the first source contact.

17. The electronic device according to claim 16, wherein at least two second source contacts are arranged adjacent to the surface areas of said first and second drain contacts and on the sides of the surface areas of the first and second drain contacts facing away from the first source contact.

18. The fT-doubler amplifier integrated circuit of claim 1, wherein the fT-doubler amplifier integrated circuit has a cutoff frequency that is at least 10% higher than a cutoff frequency of a comparable single field effect transistor in a common source topology.

19. The fT-doubler amplifier integrated circuit of claim 9, wherein the fT-doubler amplifier integrated circuit has a cutoff frequency that is at least 10% higher than a cutoff frequency of a comparable single field effect transistor in a common source topology.

20. The electronic device comprising the at least one fT-doubler amplifier integrated circuit of claim 14, wherein the fT-doubler amplifier integrated circuit has a cutoff frequency that is at least 10% higher than a cutoff frequency of a comparable single field effect transistor in a common source topology.

* * * * *